United States Patent
Li et al.

(10) Patent No.: US 11,538,955 B2
(45) Date of Patent: Dec. 27, 2022

(54) METHODS OF MANUFACTURING A PHOTOVOLTAIC MODULE

(71) Applicant: CSEM CENTRE SUISSE D'ELECTRONIQUE ET DE MICROTECHNIQUE SA—RECHERCHE ET DEVELOPPMENT, Neuchâtel (CH)

(72) Inventors: Hengyu Li, Hauterive (CH); Jordi Escarre Palou, Neuchâtel (CH); Karin Söderström, Neuchâtel (CH); Xavier Bulliard, Lussy (CH); Laure-Emmanuelle Perret-Aebi, Neuchâtel (CH); Christophe Ballif, Neuchâtel (CH)

(73) Assignee: CSEM CENTRE SUISSE D'ELECTRONIQUE ET DE MICROTECHNIQUE SA—RECHERCHE ET DEVELOPPEMENT, Neuchâtel (CH)

( * ) Notice: Subject to any disclaimer, the term of this patent is extended or adjusted under 35 U.S.C. 154(b) by 0 days.

(21) Appl. No.: 17/047,568

(22) PCT Filed: Apr. 12, 2019

(86) PCT No.: PCT/EP2019/059448
§ 371 (c)(1),
(2) Date: Oct. 14, 2020

(87) PCT Pub. No.: WO2019/201780
PCT Pub. Date: Oct. 24, 2019

(65) Prior Publication Data
US 2021/0119073 A1    Apr. 22, 2021

(30) Foreign Application Priority Data

Apr. 16, 2018 (WO) ................. PCT/EP2018/059637
Apr. 16, 2018 (WO) ................. PCT/EP2018/059640

(51) Int. Cl.
*H01L 31/18* (2006.01)
*H02S 20/22* (2014.01)
(Continued)

(52) U.S. Cl.
CPC .............. *H01L 31/186* (2013.01); *C08F 8/00* (2013.01); *C08F 230/085* (2020.02);
(Continued)

(58) Field of Classification Search
CPC . H01L 31/186; H01L 31/0481; H01L 31/048; H01L 31/18; H01L 21/469;
(Continued)

(56) References Cited

U.S. PATENT DOCUMENTS 8,513,517 B2   8/2013   Kalkanoglu et al.
9,281,186 B2   3/2016   Wootoon
(Continued)

*Primary Examiner* — Michael Y Sun
(74) *Attorney, Agent, or Firm* — Duana Morris LLP; Gregory M. Lefkowitz; Randall C. Pyles

(57) ABSTRACT

Method of manufacturing a photovoltaic module comprising at least a first layer and a second layer affixed to each other by means of an encapsulant, said method comprising a lamination step wherein the encapsulant material comprises a silane-modified polyolefin having a melting point below 90° C., pigment particles and an additive comprising a cross-linking catalyst; and wherein in said lamination step heat and pressure are applied to the module, said heat being applied at a temperature between 60° C. and 125° C.

31 Claims, 7 Drawing Sheets

(51) Int. Cl.
*H01L 31/048* (2014.01)
*H01L 21/469* (2006.01)
*H01L 23/29* (2006.01)
*H01L 23/28* (2006.01)
*H01L 33/52* (2010.01)
*C08F 230/08* (2006.01)
*C08F 8/00* (2006.01)
*C08L 23/02* (2006.01)

(52) U.S. Cl.
CPC ......... *C08F 2500/00* (2013.01); *C08L 23/025* (2013.01); *C08L 2312/00* (2013.01); *C08L 2312/08* (2013.01); *H01L 21/469* (2013.01); *H01L 23/28* (2013.01); *H01L 23/296* (2013.01); *H01L 31/0481* (2013.01); *H01L 33/52* (2013.01); *H01L 2924/181* (2013.01); *H02S 20/22* (2014.12)

(58) Field of Classification Search
CPC ....... H01L 23/28; H01L 23/296; H01L 33/52; H01L 2924/181; H02S 20/22; Y02E 10/542; Y02P 70/50; C08F 8/00; C08F 230/085; C08F 2500/00; C08L 23/025; C08L 2312/00; C08L 2312/08
See application file for complete search history.

(56) References Cited

U.S. PATENT DOCUMENTS

| | | |
|---|---|---|
| 2011/0126887 A1 | 6/2011 | Sultan et al. |
| 2012/0024348 A1* | 2/2012 | Prejean ............... B32B 27/12 136/251 |
| 2012/0152323 A1* | 6/2012 | Perry .................. B32B 27/08 136/251 |
| 2014/0034109 A1* | 2/2014 | Kim ................... B32B 27/06 136/244 |
| 2014/0202533 A1* | 7/2014 | Weaver ............ B32B 17/10018 136/259 |
| 2014/0326292 A1 | 11/2014 | Yordem et al. |
| 2014/0360560 A1* | 12/2014 | Taniguchi ............ H01L 31/049 136/251 |
| 2015/0031812 A1 | 1/2015 | Sungho et al. |
| 2015/0194557 A1* | 7/2015 | Williams ............... H02S 30/10 136/248 |
| 2015/0295111 A1* | 10/2015 | Blackwood ........... H01L 31/049 136/251 |
| 2017/0200842 A1 | 7/2017 | Bonekrup et al. |

* cited by examiner

METHODS OF MANUFACTURING A PHOTOVOLTAIC MODULE

CROSS-REFERENCE TO RELATED APPLICATIONS

This application is a § 371 national stage entry of International Application No. PCT/EP2019/059448, filed Apr. 12, 2019, and is a by-pass continuation-in-part of both International Application No. PCT/EP2018/059640, filed Apr. 16, 2018, and International Application No. PCT/EP2018/059637, filed Apr. 16, 2018, the entire contents of which are incorporated herein by reference.

TECHNICAL FIELD

The present invention relates to the technical field of photovoltaic devices. More particularly, it relates to a method of manufacturing a coloured photovoltaic module particularly suited for building-integrated applications.

STATE OF THE ART

The natural colour of photovoltaic (PV) devices, also referred to as solar cells or solar panels, tends to be near black, often with a purple or indigo tint, with a clearly-defined pattern of the individual cells being visible. When such PV devices are mounted on buildings, they can be unsightly, and it is often unacceptable to use them directly as building cladding for this reason.

In order to overcome this issue, coloured PV devices have been proposed, which enable their integration into the structure of a building, notably as exterior cladding.

Document U.S. Pat. No. 9,281,186 discloses a film placed on the front sheet of the PV device to modify the appearance of the module. However, this film requires a specific profile which necessitates alignment with the geometry of the individual PV cells making up the module, and relies on a complex design involving facets in the front sheet and embedded elements in the inactive part of the module.

US 2014/326292 discloses a PV device comprising a graphic film placed inside the module. This film is printed with a colour or texture, and requires a selective reflector layer to limit the impact of the film on the efficiency of the module.

U.S. Pat. Nos. 9,276,141 and 8,513,517 disclose decorative film overlays placed on or within a PV module, as do US 2012/247541 and WO 2016/118885.

EP2793271 describes a white photovoltaic module in which an interference filter is formed on an intermediate layer deposited on the light-incident side of the photovoltaic module so as to reflect a certain amount of light over the whole visible spectrum. Specialised equipment and techniques are required to produce this interference filter.

However, all of these prior art solutions are either complex, or require extra layers to be applied to modules. Essentially, for each additional layer added to a module, the risk of delamination of the module increases since there are more interfaces between layers which can separate. Furthermore, special manufacturing techniques or equipment may be required.

WO2009/089236 proposes a solution to this problem. In the embodiment of FIG. 7 of this document, the front encapsulation layer itself comprises pigment particles randomly dispersed therein. This hence does away with the need for extra coloured film layers in addition to the front encapsulation layer, but presents a whole different set of problems. Since the encapsulants used in this document are conventional, and are laminated at conventional lamination temperatures of the order of 130° C.-170° C., under a pressure of up to 1 bar, the pigment particles can migrate during lamination. This leads to significant non-homogeneity of the coloration. Furthermore, in extreme cases, excessive encapsulant flow can lead to significant thickness variations within the module, particularly with respect to zones in which a PV cell is present and zones in which no PV cell is present. This again results in colour variations across the module.

Furthermore, secondarily, the standard temperatures and pressures, while compatible with most standard PV cell technologies, such as thin-film silicon, crystalline silicon, and germanium-based cells, are typically incompatible with perovskite-based, organic and dye-sensitised cells. These latter types of cells, which are also known as Grätzel cells, employ a photosensitive dye absorbed onto a thin film of titanium dioxide and use a liquid or gel-based electrolyte, which can be damaged if heated to above about 90° C. As a result, these cells are incompatible with conventional lamination techniques. Perovskites are similarly heat-sensitive, although not to the same degree.

An aim of the present invention is hence to propose a method of manufacturing a coloured photovoltaic module with a desired colouration, which is, as a secondary consideration, also compatible with lamination of dye-sensitised, perovskite and other temperature-sensitive photovoltaic technologies.

DISCLOSURE OF THE INVENTION

More specifically, the invention relates to a method of manufacturing a photovoltaic module comprising at least a first layer and a second layer affixed to each other by means of an encapsulant. Although the photovoltaic module of course comprises a photovoltaic conversion device, it does not have to be either of the first or second layers, although it may indeed be one of them. The method comprises steps of:

providing a lamination device such as a vacuum bag laminator;

disposing said first layer in said lamination device, said first layer being for instance a front sheet, a back sheet or any other layer, either alone or as part of a pre-existing, pre-fabricated PV module or a portion thereof;

disposing upon said first layer an encapsulant material manufactured by the steps of (a) providing a base resin comprising a silane-modified polyolefin (such as an ethylene-containing co-polymer), said base resin having a melting point below 90° C., (b) forming a mixture of said base resin, pigment particles of a convenient type, size and concentration, and an additive comprising at least a cross-linking catalyst, said cross-linking catalyst being present in a proportion of 0.01 to 20, preferably 0.01 to 5 parts per hundred of resin, (c) melting said mixture at a temperature between 90° C. and 190° C., preferably between 160° C. and 180° C. and (d) extruding said mixture to form said encapsulant material, which may then be placed on the first layer as a sheet and/or as a powder;

disposing said second layer upon said encapsulant material, said second layer being e.g. a photovoltaic conversion device, an internal front sheet forming part of a pre-existing PV module, or any other layer as appropriate, laminating said first layer, said second layer and said encapsulant material under application of heat and pressure, said heat being applied at a temperature between 60° C. and 125° C., preferably between 60° C. and 100° C., further preferably between 70° C. and 90° C., so as to crosslink said base resin.

During lamination at temperatures up to 125° C., the encapsulant resin as specified above can be at least partially cross-linked, resulting in mechanical properties suitable for use in PV modules, namely sufficient rigidity and resistance to creep at the highest service temperatures to be expected (i.e. around 85° C., and even up to 105° C. to add a safety margin). The cross-linking can also take place or continue after the module lamination has finished.

The lower processing temperature than usual results in higher than normal viscosity and lower than normal Tan Delta during lamination, which prevents migration and aggregation of pigment particles, as well as excess flowing of the pigmented encapsulant, resulting in a homogeneous coloration of the module. This result is surprising, and shows an unexpected synergy between the low-temperature processing and the use of pigments to give colour to the module.

Furthermore, this combination of a particular encapsulant with lower than normal lamination temperatures is also suitable to be used when laminating not only conventional PV modules, but also PV modules comprising temperature-sensitive PV cells, such as perovskite-based, organic or dye-sensitised cells in conventional lamination equipment. Also, reduced processing temperatures during lamination reduce energy consumption. It should be noted that one of the first and second layers mentioned above may form part of a pre-existing, pre-fabricated PV module, upon which a further layer is being laminated, or may be an individual layer of a PV module.

In an alternate method according to the invention, the method comprises steps of:

providing a lamination device;

disposing said first layer (as above) in said lamination device, disposing upon said first layer an encapsulant material manufactured by (a) providing a base resin in the form of a powder, said base resin comprising a silane-modified polyolefin (such as an ethylene-containing copolymer) and having a melting point below 90° C., (b) mixing said base resin powder with pigment particles of a convenient type, size and concentration together and also with at least an additive in the form of a powder or liquid so as to form said encapsulant material, said additive comprising a cross-linking catalyst present in said encapsulant material in a proportion of 0.01 to 20, preferably 0.01 to 5 parts per hundred of resin (considered in terms of the total encapsulant material mixture). This powdered encapsulant material is disposed upon said first layer in powder form;

disposing said second layer (as above) upon said encapsulant material, laminating said first layer, said second layer and said encapsulant material under application of heat and pressure, said heat being applied at a temperature between 60° C. and 125° C., preferably between 60° C. and 100° C., further preferably between 70° C. and 90° C. so as to crosslink said base resin.

During lamination at temperatures up to 125° C., the resin is cross-linked in the same manner as above even though the particles of catalyst and base resin are discrete, resulting in mechanical properties suitable for use in PV modules, namely sufficient rigidity and resistance to creep at the highest service temperatures to be expected (i.e. around 85° C., and even up to 105° C. to add a safety margin).

The lower processing temperature than usual again results in higher than normal viscosity and lower than normal Tan Delta during lamination, which prevents migration and aggregation of pigment particles as well as excessive flow of encapsulant material during lamination, resulting in a homogeneous coloration of the module. This result is surprising, and shows an unexpected synergy between the low-temperature processing and the use of pigments to give colour to the module.

This method can also thus be used when laminating not only conventional PV modules, but also PV modules comprising temperature-sensitive PV cells, such as perovskite-based or dye-sensitised cells in conventional lamination equipment. Also, reduced processing temperatures during lamination reduces energy consumption. Again, it should be noted that one of the first and second layers mentioned above may form part of a pre-existing, pre-fabricated PV module, upon which a further layer is being laminated, or may be an individual layer of a PV module.

Advantageously, said base resin has a complex viscosity of greater than 10000 Pa·s at 85° C., and greater than 6000 Pa·s at 100° C. before lamination.

Advantageously, said base resin exhibits a tan delta value lower than 1.0 at 85° C. and lower than 1.2 at 100° C. before lamination.

The aforementioned properties give good processability of the resulting encapsulant material.

Advantageously, said mixture further comprises a further additive comprising at least one of: an antioxidant; an ultraviolet absorber; an ultraviolet stabiliser. This further additive may be mixed and/or compounded with the base resin at the same time as mixing and/or compounding with the catalyst, or in a separate step before the resulting mixture is mixed and/or compounded with the catalyst.

Advantageously, said catalyst comprises one or more of: boric acid; a metallocene catalyst; a constrained geometry catalyst; a chain shuttling-types of catalyst; a multi-site catalyst such as a Ziegler-Natta or Phillips catalyst. Such cross-linking catalysts may include carboxylates of metals (e.g. cobalt, tin, zinc, iron, lead etc.), dialkyl tin mercaptide, stannous octoate, dibutyl tin dilaurate, dibutyl tin diacetate, dioctyl tin dilaurate, stannous acetate, stannous caprylate, zinc caprylate, organic bases such as ethyl amines, dibutyl amine or hexylamines, inorganic acids such as sulphuric acid, or organic acids such as toluene sulphonic acid, stearic acid and maleic acid.

Advantageously, after said step of lamination, said encapsulant material exhibits a complex viscosity greater than 15000 Pa·s at 85° C. and greater than 10000 Pa·s at 100° C.

Advantageously, after said step of lamination, said encapsulant material exhibits a tan delta value of less than 1.0 at 85° C. (preferably less than 0.8 at 85° C.) and less than 1.2 at 100° C. (preferably less than 1.0 at 100° C.).

These properties are sufficient to give the required structural stability and resistance to creep at the required service temperatures immediately after the lamination. As the cross-linking will further develop after the lamination, the creep resistance of the encapsulant layer will be further improved.

Advantageously, at least some, preferably at least 50% or even at least 75%, of said pigment particles have a median diameter ranging from 100 nm to 50 µm, preferably from 100 nm to 5 µm, preferably 300-700 nm, more preferably 400-600 nm. The diameter of the particles can be optimised for the desired optical properties of the front encapsulant layer. Likewise, the pigment particles can be provided in said front encapsulation layer in a mass concentration ranging from 0.01 to 10 parts per hundred of resin, which can again be tuned to optimise the desired properties. It goes without saying that the exact particle size and concentration can be arrived at by routine experimentation to achieve the desired optical properties (colour, reflectivity, transmissivity, special interference effects and so on), and there is no particular a priori particle size to particle concentration relationship—this relationship depends simply on the desired optical properties.

Advantageously, said pigment comprises at least one of Zinc-based pigments (such as Zinc oxide or zinc chromate), Titanium-based pigments (such as Titanium oxide or titanium yellow), Iron-based pigments (such as iron oxides or Prussian blue), Chromium-based pigments (such as chromium oxides), Bismuth-based pigments (such as bismuth vanadate), Cobalt-based pigments (such as cobalt blue or cobalt stannate or Cobalt/lithium/Titanium oxides), Aluminium-based pigments (such as complex sulphur-containing sodium silicates), Tin-based pigments (such as stannic sulfide), or Copper-based pigments.

Such a photovoltaic module is naturally suitable for incorporation in or on a building structure.

BRIEF DESCRIPTION OF THE DRAWINGS

Further details of the invention will appear more clearly upon reading the description below, in connection with the following figures which illustrate.

EMBODIMENTS OF THE INVENTION

It should be noted in the following that, unless explicitly stated that a particular layer is disposed directly on the adjacent layer, it is possible that one or more intermediate layers can also be present between the layers mentioned. As a result, "on" should be construed by default as meaning "directly or indirectly on". Furthermore, patterning of certain layers, connectors and so on are not represented since they are well-known to the skilled person.

Figure 1:
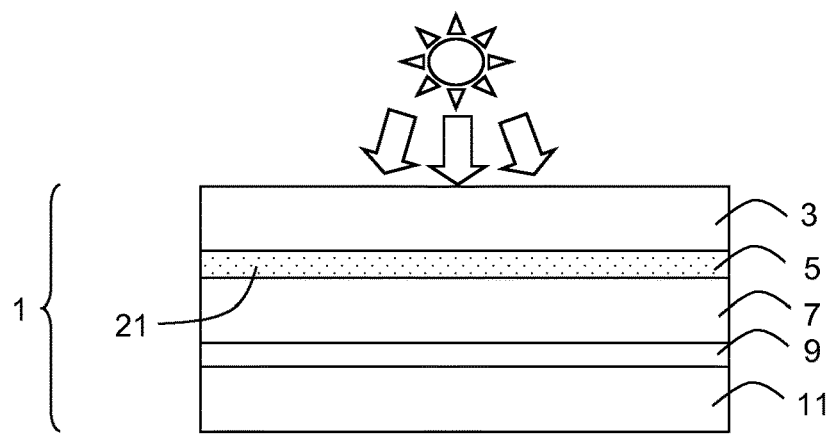
FIG. 1: a schematic cross-sectional view of a photovoltaic module manufactured according to the invention.

FIG. 1 illustrates a classical construction of a photovoltaic module 1, which comprises a front sheet 3, on the light incident side of the module 1, intended to be illuminated when in use (as indicated in the figures by means of a sun symbol), and a back sheet 11, on the opposite side of the module 1 to the front sheet 3. The front sheet 3 may be glass, transparent ceramic, polymer or any other convenient substantially transparent material, and the back sheet may be metal, glass, ceramic, polymer or any other convenient material. The front sheet 3 may be structured, and may be provided with coatings. One of the front sheet 3 and the back sheet 11 may represent a "first layer" in the sense of the invention, the layer to which this first layer is encapsulated by means of an encapsulant layer corresponding to a "second layer" in the sense of the invention. Alternatively, any two particular layers of the PV module's construction which are encapsulated together may represent the first and second layers in the sense of the invention, or either of the first and second layers may form part of a pre-existing, pre-fabricated PV module to which another layer or layers are being laminated.

Situated between the front 3 and back 11 sheets is a photovoltaic conversion device 7 comprising one or more PV cells comprising NIP, PIN, NP or PN junctions, patterned and interconnected as is generally known. The PV cells may be based on thin-film silicon, crystalline silicon, germanium, perovskite, dye-sensitised cells, or any other type of PV technology adapted to generate electrical power from light impinging on the light-incident side of the PV module 1 and passing into the photoelectrically-active portions of the PV conversion device 7. Although the invention is particularly applicable for encapsulation of PV modules incorporating dye-sensitised and perovskite cells, it can equally be applied to any PV cell technology.

The PV conversion device 7 is encapsulated on its light incident side by a front encapsulant layer 5, which seals it to the front sheet 3, and on its back side by a rear encapsulant layer 9. This latter seals the PV conversion device 15 to the back sheet 19, although it may indeed itself form the rear sheet. Each of the encapsulant layers 5, 9 is typically between 200 µm and 1 mm thick. Furthermore, multiple front encapsulation layers 3 can be stacked on top of each other. The front and/or back encapsulant layers 5, 9 are specially manufactured according to the invention, and will be described in more detail below.

It should be noted that other intermediate layers may be provided between the illustrated layers, and that the layers do not have to be flat and can describe curves or more complex surfaces. In such a case, use of powdered encapsulant material on its own or in combination with a film thereof can be advantageous in order to ensure that all details of the shape are filled with encapsulant. Indeed, the same principle can be applied irrespective of the shape of the layers, using powdered encapsulant to fill in certain zones on the underlying layer, in order to ensure a homogeneous encapsulant layer after lamination.

Figure 2:
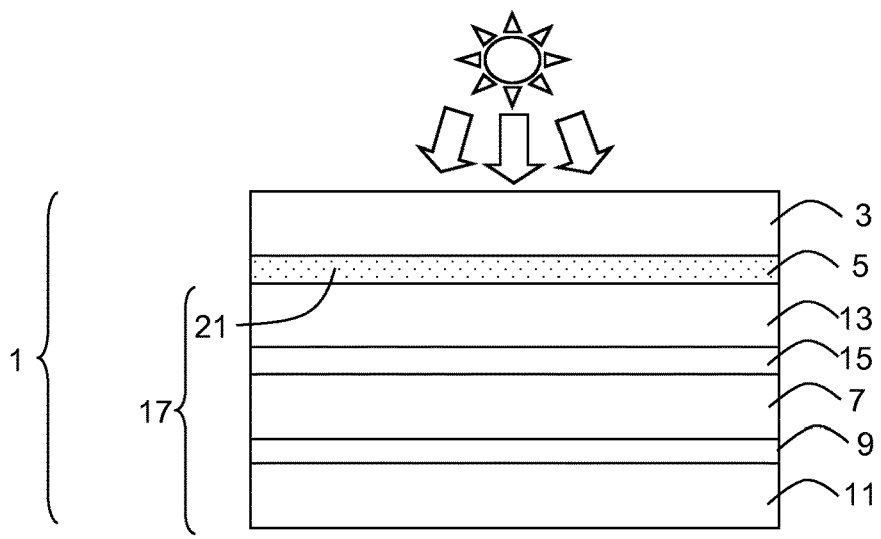
FIG. 2: a schematic cross-sectional view of a further photovoltaic module manufactured according to the invention.

FIG. 2 illustrates a further variant of the structure of a PV module 1, which is manufactured by laminating the front sheet 3 to a pre-existing, pre-fabricated PV module 17 by means of front encapsulant 5. The other layers 7, 9 and 11 are as previously designated. As a result, the original front sheet and front encapsulant of the pre-fabricated module 17 become an internal front sheet 13 and a further encapsulant layer 15 respectively. The same comments regarding rear encapsulant 9 and back sheet 11 apply as before. This structure enables functionalisation of the front side of the pre-existing module 17 by means of a front sheet 3 that is structured, printed, comprises desirable additives, comprises an optical filter such as that disclosed in EP2994940, US2017/123122 or US2017/033250, or exhibits similar functionalisation.

Figure 3:
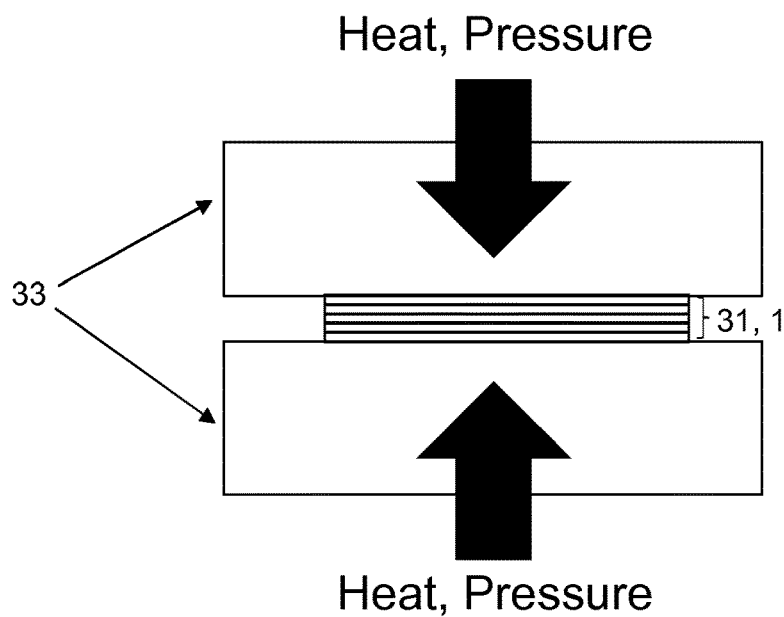
FIG. 3: a schematic view of a method of manufacturing a photovoltaic module.

FIG. 3 represents schematically a method of manufacturing a PV module 1 according to the invention.

A layer stack 31 comprising at least the layers 3, 5, 7 and 9, together with any other layers present, is assembled in a lamination device 33. In the case of the embodiment of FIG. 2, the layer stack comprises a pre-fabricated PV module 17, upon which front encapsulant layer 5 and front sheet 3 (and any other desired layers) have been applied. It should be noted that the layer stack 31 can be assembled in the lamination device 33 either with the light-incident side of the final PV module facing downwards or facing upwards, this orientation determining which particular layers are the "first" and "second" layers in the sense of the invention. Furthermore, one or more of the encapsulant layers 5, 9 may be applied to the layer stack 31 as a film and/or as a powder.

The lamination device may be a vacuum bag laminator, roller-type laminator, or any other convenient type. The lamination device 33 then applies heat and pressure at a lower temperature than normal, notably at between 60 and 125° C. preferably between 60° C. and 100° C., further preferably between 70° C. and 90° C., and a pressure of up to 2 bar gauge (normally substantially 1 bar gauge), for an appropriate length of time (e.g. between 20 and 2000 minutes), which causes the various encapsulant layers to fuse and cross-link and thereby to assemble the final PV module 1.

As a result, the PV module 1 according to the invention can be made in conventional PV processing equipment, without requiring specialised equipment. Furthermore, the reduced processing temperature reduces energy consumption in manufacture.

In order to permit lamination at the lower than normal temperatures mentioned above while retaining the desired mechanical properties of the encapsulant after lamination and in service, at least one encapsulant layer 5, 9 is manufactured specially as described below.

The encapsulant layer or layers 5, 9 in question is formed from a silane-modified polyolefin base resin such as polyethylene or other ethylene-based polymer or co-polymer, or a mixture of such polymers. Such base resins incorporate silane functional groups already grafted onto the polymer molecules and are commercially available, e.g. from Padanaplast, Dow, Evonik and other companies. In the following, certain specific formulations will be referred to by their manufacturer's references which are unchanging with respect to the specific formulation. Reproducibility is thus ensured for the skilled person.

Such base resins are typically obtainable by processing one or more polyolefins (such as a polyethylene, a polypropylene, or a copolymer of ethylene or propylene with another monomer selected from $C_3$-$C_{10}$ alkenes, or similar) in the presence of a compound comprising hydrolysable silane groups. Other examples of polyolefins are allyl cyclohexane, vinyl cyclohexane, norbonene, polystyrene, acrylic, acrylate polymers, methacrylates such as PMMA, and so on. For further examples of polyolefins, one can consult the standard ASM D883-12, or Ullman's Encyclopedia of Industrial Chemistry. The processing of the base resin can e.g. be carried out by melt processing the one or more polyolefins, in the presence of a compound comprising hydrolysable silane groups and a compound capable of generating free radicals. However, since such base resins are available off-the-shelf from several manufacturers, the skilled person need only select a suitable one and need not synthesise it himself.

The base resins in question ideally have the following properties before lamination:

TABLE 1

| Parameter | Value |
| --- | --- |
| Density | <0.92 g/cm$^3$ |
| Melting point | <90° C. |
| Complex viscosity at 85° C. | <30000 Pa · s and >10000 Pa · s |
| Complex viscosity at 100° C. | <20000 Pa · s and >6000 Pa · s |
| Tan Delta at 85° C. | <1, ideally >0.1 or even >0.2 |
| Tan Delta at 100° C. | <1.2, ideally>0.1 or even >0.4 |

For reference, complex viscosity is the frequency-dependent viscosity function determined during forced harmonic oscillation of shear stress, and is defined as the complex modulus divided by angular frequency, where complex modulus represents the overall resistance to deformation of the material, regardless of whether that deformation is recoverable, i.e. elastic, or non-recoverable, i.e. viscous. This is measured with a dynamic moving-die rheometer or similar tool, in the present case at 1 Hz frequency and 10% strain. Tan Delta, also known as the "Loss Tangent", is the tangent of the phase angle characterising the ration of viscous modulus (G") to elastic modulus (G'), and quantifies the presence and extent of elasticity in a fluid. Tan delta values of less than 1.0 indicate elastic-dominant (i.e. solidlike) behaviour and values greater than unity indicate viscous-dominant (i.e. liquid-like) behaviour, again at 1 Hz frequency and 10% strain.

The density range cited represents an optimum in respect of the crystallinity and the melting point of the base resin, the melting point range ensures that the encapsulant can be melted at low lamination temperature, and the viscosity and the tan delta values are important values reflecting the processability of the encapsulant under standard lamination conditions. Concrete, commercially-available examples of resins with these properties are given in the examples below, however the skilled person knows how to select others based on the properties given by consulting appropriate material data sheets. In essence, it has been shown that polymers having the properties mentioned are laminatable at the required temperatures, whereas those with parameters outside these ranges are typically not suitable.

The base resin is combined with a cross-linking catalyst in a concentration of between 0.01 phr and 5 phr, or even up to 20 phr. This catalyst may comprise boric acid as a source of water, a metallocene catalyst, a constrained geometry catalyst, a chain shuttling-type of catalyst, a multi-site catalyst such as a Ziegler-Natta or Phillips catalyst, or any other type of catalyst suitable to catalyse the cross-linking of polyolefin molecules by means of silane and water, which may be ambient water and/or provided e.g. by boric acid or a similar compound which decomposes to liberate water when heated. The catalyst may be provided as a powder or a liquid solution, or already incorporated with a polymer in a catalyst master batch. Further examples of such catalysts are: carboxylates of metals (e.g. cobalt, tin, zinc, iron, lead etc.), dialkyl tin mercaptide, stannous octoate, dibutyl tin dilaurate, dibutyl tin diacetate, dioctyl tin dilaurate, stannous acetate, stannous caprylate, zinc caprylate, organic bases such as ethyl amines, dibutyl amine or hexylamines, inorganic acids such as sulphuric acid, or organic acids such as toluene sulphonic acid, stearic acid and maleic acid.

In the following, such catalyst preparations are again referred to by their manufacturer's references which are unchanging with respect to the specific formulation. Reproducibility is thus ensured for the skilled person.

Other additives, such as an antioxidant, a UV absorber and/or a UV stabiliser can be added to the encapsulant base resin, e.g. in a concentration of 0.1% to 5%. Furthermore, the encapsulant comprises pigment particles as a further additive. Such particles may, for instance, be present in concentrations ranging from 0.01 to 10 phr or wt %, preferably 0.1-5 phr or wt %, further preferably 0.1-1 phr or wt %, and have a size ranging from 100 nm to 50 μm, most notably from 100 nm to 1 μm, particularly from 300-700 nm, and most particularly from 400-600 nm. Preferably at least 50%, further preferably at least 75%, further preferably substantially all the pigment particles have the stated size. It is noted that pigment particles are discrete particles, which are distinct from a colorant dispersed at molecular level in the encapsulant or an encapsulant made from an already coloured material. As examples of suitable pigments, titanium oxide or zinc oxide particles may be used to generate a white colour. Yellow, orange, red and brown colours can be generated by using various iron oxides such as $Fe_2O_3$ for red ochre, or $FeO(OH)$ for yellow. Blues can be generated e.g. by means of a complex sulphur-containing sodium silicate or Prussian blue. Such pigment particles 21 absorb part of the visible light incident on the PV device 1 so as to generate the desired colour, and also diffuse light which provides a homogeneous colour and helps to hide the various features of the PV conversion device 15 such as its patterning, the tracks of electrical interconnections between the individual cells, the edges of the individual cells, the colour mismatches between the individual cells and the rear encapsulant 17 and/or backsheet 19, and so on.

More specific examples of particular off-the-shelf pigments which have been trialled with success are:

Red: iron oxide red pigments, e.g. Rot 110M from Scholz Farbpigmente Schweiz, Sicocer® F Coral 2320 from BASF. Typical dose: 0.05 to 2 phr;

White: Dupont Ti-Pure R-900, R-960 from Dupont. Typical dose: 0.1 to 1 phr;

Yellow: Nubifer Y-4000 series from Ferro corporation. Typical dose: 0.1 to 2 phr; and Green: PG17 S Series from Ferro corporation, SICOPAL® GREEN K 9610 or 9710 from BASF. Typical dose: 0.05 to 2 phr Of course, other commercially-available, off-the-shelf pigment products are also suitable, such as those comprising Zinc-based pigments (such as Zinc oxide or zinc chromate), Titanium-based pigments (such as Titanium oxide or titanium yellow), Iron-based pigments (such as iron oxides or Prussian blue), Chromium-based pigments (such as chromium oxides), Bismuth-based pigments (such as bismuth vanadate), Cobalt-based pigments (such as cobalt blue or cobalt stannate or Cobalt/lithium/Titanium oxides), Aluminium-based pigments (such as complex sulphur-containing sodium silicates), Tin-based pigments (such as stannic sulfide), or Copper-based pigments.

The pigment particles 21 absorb part of the visible light incident on the PV device 1 so as to generate the desired colour, and also diffuse light which provides a homogeneous colour and helps to hide the various features of the PV conversion device 7 such as its patterning, the tracks of electrical interconnections between the individual cells, the edges of the individual cells, the colour mismatches between the individual cells and the rear encapsulant 9 and/or backsheet 11, and so on.

This scattering effect is particularly advantageous over simply providing a front encapsulant which is coloured by means of a colorant dispersed therein at a molecular level, since such a colourant results in a much greater degree of optical transparency due to the lack of light scattering and hence does not hide the various features of the PV conversion device 7 as described above.

Furthermore, the scattering effect helps to diffuse the light that passes through the front encapsulant 5 and enters into the photovoltaically-active parts of the PV conversion device 7, increasing the average path length of light through the cell, in a manner similar to a conventional diffusion element incorporated in a PV module 1 on the light-incident side of the PV conversion device 7. Of course, the overall efficiency is reduced in proportion to the light reflected or scattered back towards the light-incident side of the PV device.

The size of the pigment particles 21 can be tuned to increase the transmittance in the infrared range for PV conversion devices 5 which are sensitive to IR light, and interference can be generated between the pigment particles 21 to give shiny, shimmering, or rainbow effects by optimising the pigment particle size and their density in the front encapsulant layer 5. More generally, the pigment particle size and concentration, front encapsulant layer thickness and so on can be tuned by routine experimentation within the bounds mentioned above in order to achieve the desired colour, optical effect, transmissivity, reflectivity and so on.

Figure 4:
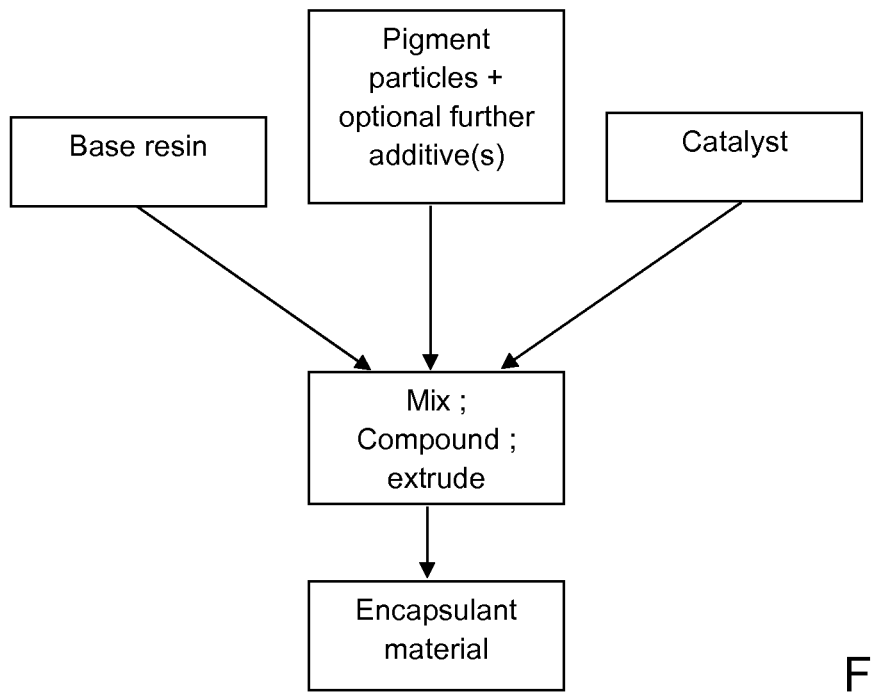
FIGS. 4-7: schematic representations of methods of manufacturing encapsulant materials according to the invention.
Figure 5:
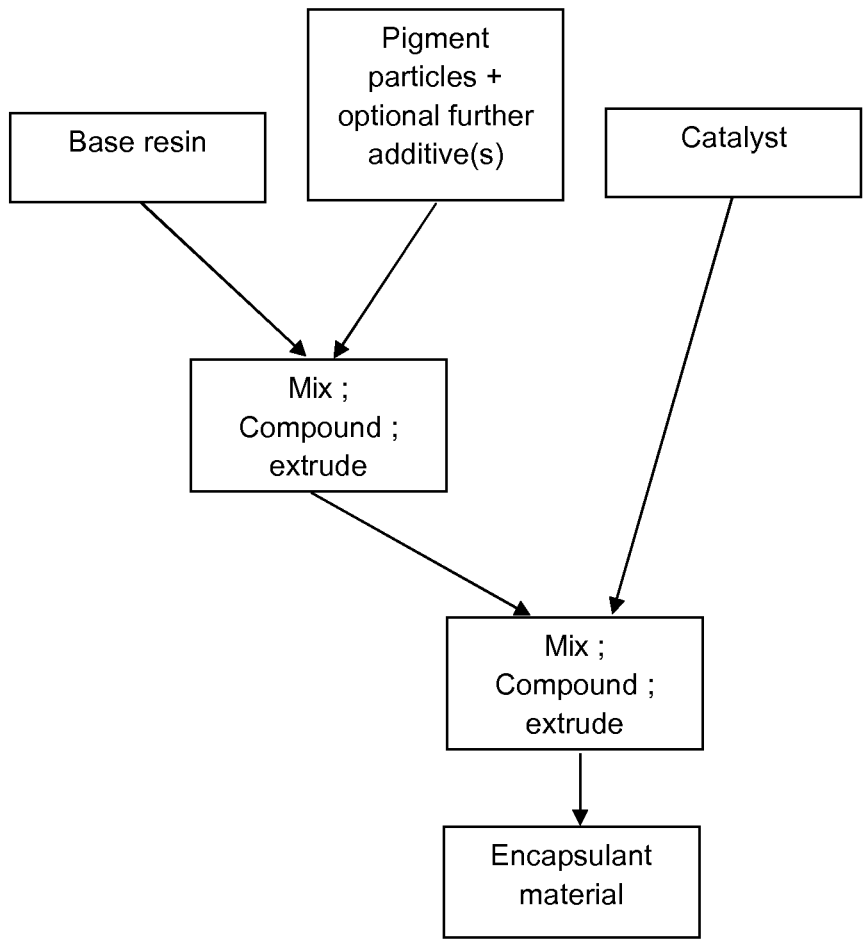

The mixture of base resin, pigment particles and catalyst (plus any other additives) can be compounded and then extruded, e.g. by a twin-screw extruder or other form of extruder at a temperature of 90° C. to 190° C., preferably from 140° C. to 180° C., preferably from 160° C. to 180° C., preferably from 165° C. to 175° C. so as to form a film of encapsulant material, or in any other convenient form (such as a cylinder) which is then ground into a powder. This is illustrated schematically in FIG. 4, in which the base resin, catalyst preparation (which comprises either a catalyst powder, solution, or catalyst master batch comprising a catalyst already compounded with a polymer) are mixed, compounded and extruded. FIG. 5 illustrates schematically another variant of this process, in which the base resin is first mixed and compounded with further additives such as UV absorbers, UV stabilisers and/or antioxidants and then extruded, the resulting mixture being subsequently mixed and compounded with a catalyst preparation (as described above), and extruded.

With conventional extrusion processes, the relatively short residence time of the melt in the extruder before it solidifies ensures that relatively little cross-linking of the polymer occurs. However, some may indeed occur, but is unproblematic. In case of issues with excessive cross-linking in the extruder, the skilled person can easily modify the extrusion parameters (temperature, extrusion pressure, extrusion flow rate etc.) with routine experimentation to resolve such an issue. The sheet and/or powder can thus be placed in the layer stack 31 in the lamination device 33 as described above. Upon application of heat and pressure, the silane cross-links the polymer molecules in the presence of water (which may come e.g. from a boric acid or other component of the catalyst) at the laminating temperature, causing the encapsulant material to harden and to bond to the adjacent layers.

Figure 6:
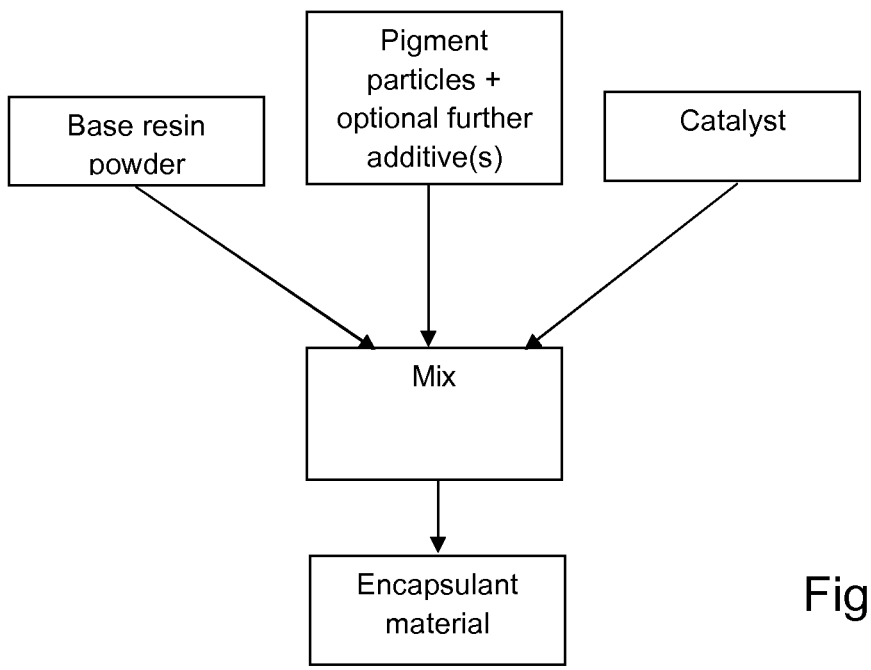
Figure 7:
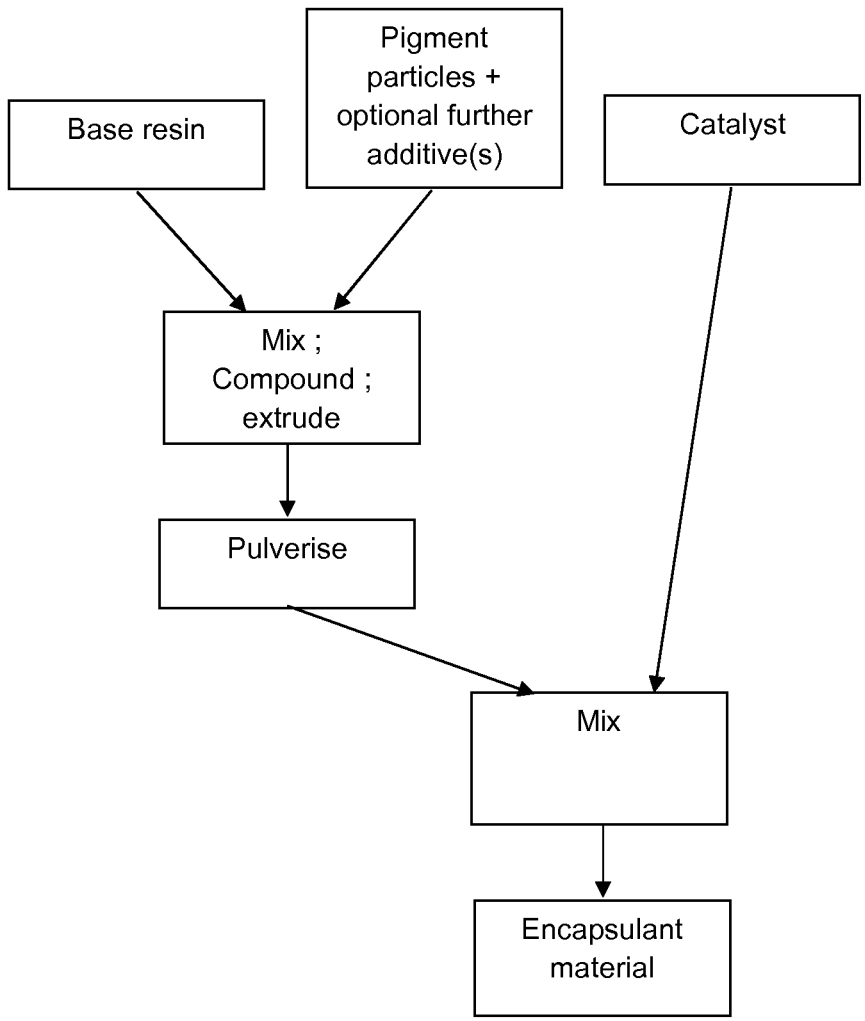

In another variant, the base resin and any additives other than the catalyst can be compounded and extruded at the temperatures mentioned above, into a form such as a cylinder or strand, and then ground into a powder. This base resin powder can then be mixed with a crosslinking agent powder or liquid containing the crosslinking agent (i.e. catalyst) material (either on its own or already compounded with a polymer), the pigment particles and optionally also with further additives such as an antioxidant, a UV absorber and/or a UV stabiliser, as illustrated schematically in FIG. 6. This powder may have a particle size of 1 to 1000 μm, preferably from 1 to 100 μm. The resulting powder mixture constitutes the encapsulant material of the invention. In a further variant of this process represented schematically in FIG. 7, the base resin (which may be a powder, pellets or any other convenient form) and further additives as described above are first mixed, compounded and extruded, and the resulting mixture is then pulverised to form a powder. This latter powder is then mixed with crosslinking agent in powder or liquid form as above (with or without polymer component) to form the encapsulant material powder.

This powder mixture can then be placed in the layer stack 31 as described above, and upon application of heat at 60° C. to 125° C., preferably between 60° C. and 100° C., further preferably between 60° C. and 85° C., and pressure from 0.5 to 2 bar gauge, the crosslinking agent will interact with the base resin when these components soften and combine, cross-linking the polymer of the base resin in the same manner as in the case in which the crosslinking agent is mixed with the base resin before extrusion.

After lamination, the resulting encapsulant has the following modified properties, which provide the desired strength and creep resistance in service:

TABLE 2

| Parameter | Value |
| --- | --- |
| Complex viscosity at 85° C. | >15000 Pa · s |
| Complex viscosity at 100° C. | >10000 Pa · s |
| Tan Delta at 85° C. | <1.0, preferably <0.8 |
| Tan Delta at 100° C. | <1.2, preferably <1.0 |

As a result, the rheological behaviour of the encapsulant material during the whole process is controlled, which prevents migration of the pigment particles and excess material flow during lamination. Aggregation of the pigment particles and significant flowing of the encapsulant material is avoided, resulting in a homogeneous coloration of the module. This is because the viscosity of the encapsulant remains high (>=4000 Pa·s complex viscosity, the tan delta value of the encapsulant also ideally remaining below 1.2, preferably below 1.0) during the whole process, preventing this pigment particle migration, particularly during the early stages of lamination in which heat is applied. During this phase of conventional lamination, relatively low viscosity is typically generated before the encapsulant has had time to start to cure, allowing migration and aggregation of pigment and the excess material flow that causes significant thickness variation of the encapsulant layer. Indeed, this synergy between low-temperature lamination and avoiding pigment migration and excess material flow gives an entirely unexpected technical effect, allowing very uniform coloration of the modules.

A number of test results without pigments are reproduced below, which demonstrate that that the method of the invention achieves the desired result of good low-temperature lamination, and provide concrete examples of particular combinations of materials which achieve the desired mechanical and rheological properties of the encapsulant layer.

Example 1

TABLE 3

| Base resin | Catalyst master batch (phr) | Antioxidant (phr) | UV absorber (phr) | UV stabilizer (phr) |
|---|---|---|---|---|
| Padanaplast Polidiemme FE1252 EXP | Padanaplast CT 0552/09 (0.2) | Tris(2,4-ditert-butylphenyl)phosphite (0.2) | None | Bis(2,2,6,6-tetramethyl-4-piperidinyl)sebacate (0.2) |

Table 3 details the formulation of this example, in which "phr" relates to parts per hundred of resin. The antioxidant and UV stabilizer were first compounded into an additive master batch by a twin-screw extruder at 170° C. Then a mixture of the base resin, the catalyst master batch and the additive master batch were extruded by a single-screw extruder at 170° C. into a film of 0.5 mm thick. The extruded film was then tested in a series characterization steps.

The film was first laminated between two glass plates each 3 mm thick at 85° C. with a total cycle time of 60 minutes in a standard flat-bed vacuum-bag laminator. The resulting laminate was free of voids and other visual defects. The post-lamination peeling strength between the foil and the glass was measured to be over 10 N/mm, as measured by a standard 90° peel test carried out with a standard tensile tester. Then, the laminated glass plates were subjected to a standard creep test at 85° C. and 85% relative humidity, showing no creep occurring after 100 hours under the weight of the glass, which is equivalent to 15 kg/m$^2$ of the laminate.

Example 2

TABLE 4

| Base resin | Catalyst master batch (phr) | Antioxidant (Phr) | UV absorber (phr) | UV stabilizer (phr) |
|---|---|---|---|---|
| Dow Engage 8130 (50%) + Padanaplast FE1252 EXP (50%) | Padanaplast catalyst master batch LV1 (0.2) | Irganox B 225 (0.3) | Phenol, 2,2'-methylene-bis(6-(2H-benzotriazol-2-yl)-4-(1,1,3,3-tetramethyl-butyl)) (0.2) | 1,5,8,12-Tetrakis(4,6-bis(N-butyl-N-1,2,2,6,6-pentamethyl-4-piperidylamino)-1,3,5-triazin-2-yl]-1,5,8,12-tetraazadodecane (0.2) |

Table 4 details the formulation of this example. The antioxidant, UV absorber and UV stabiliser were first compounded into an additive master batch by a twin-screw extruder at 170° C. Then the mixture of the base resin (which in this case comprises a 50:50 blend of two different resins as indicated in the table), the catalyst master batch and the additive master batch were extruded by a single-screw extruder at 170° C. into a film of 0.5 mm thick. The extruded film was then tested in a series characterization steps.

The film was first laminated between two glass plates each 3 mm thick at 85° C. with a total cycle time of 60 minutes in a standard flat-bed vacuum-bag laminator. The resulting laminate was free of voids and other visual defects. The peel strength between the foil and the glass was measured to be over 5 N/mm after the lamination by a standard 90° peel test as above. Then the laminated glass plates were subject to a standard creep test (as above) at 85° C. and 85% relative humidity, showing no creep occurring after 100 hours.

Example 3

TABLE 5

| Base resin | Catalyst master batch (phr) | Antioxidant (Phr) | UV absorber (phr) | UV stabilizer (phr) |
|---|---|---|---|---|
| Yparex 0H145 | Padanaplast CT 0552/09 (0.3) | Irganox B 225 (0.3) | Phenol, 2,2'-methylene-bis(6-(2H-benzotriazol-2-yl)-4-(1,1,3,3-tetramethyl-butyl)) (0.2) | 1,5,8,12-Tetrakis[4,6-bis(N-butyl-N-1,2,2,6,6-pentamethyl-4-piperidylamino)-1,3,5-triazin-2-yl]-1,5,8,12-tetraazadodecane (0.2) |

Table 5 details the formulation of this example. The antioxidant, UV absorber and UV stabilizer were first compounded into an additive master batch by a twin-screw extruder at 170° C. Then the mixture of the base resin, the catalyst master batch and the additive master batch were extruded by a single-screw extruder at 170° C. into a film of 0.5 mm thick. The extruded film was then tested in a series characterization steps.

The film was first laminated between two glass plates each 3 mm thick at 85° C. with a total cycle time of 60 minutes in a standard flat-bed vacuum-bag laminator. The resulting laminate was free of voids and other visual defects. The peel strength between the foil and the glass was measured to be over 5 N/mm after the lamination by a standard 90° peel test as above. Then the laminated glass plates were subject to the same creep test as above at 85° C. and 85% relative humidity, showing no creep occurring after 100 hours.

Example 4

TABLE 6

| Base resin | Catalyst master batch (phr) | Antioxidant (phr) | UV absorber (phr) | UV stabilizer (phr) |
|---|---|---|---|---|
| Evonik Vestoplast 508 | Padanaplast Catalyst Masterbatch LV1-LR (0.3) | Tris(2,4-ditert-butylphenyl)phosphite (0.2) | None | 1-Acetyl-4-(3-dodecyl-2,5-dioxo-1-pyrrolidinyl)-2,2,6,6-tetramethyl-piperidine (0.2) |

Table 6 details the formulation of this example. The antioxidant and UV stabiliser first compounded into an additive master batch by a twin-screw extruder at 190° C. Then a mixture of the base resin, the catalyst master batch and the additive master batch were extruded by a single-screw extruder at 190° C. into a film of 0.5 mm thick. The extruded film was then tested in a series characterization steps.

The foil film was first laminated between two glass plates each 3 mm thick at 85° C. with a total cycle time of 60 minutes in a standard flat-bed vacuum-bag laminator. The resulting laminate was free of voids and other visual defects. The peel strength between the foil and the glass was measured to be over 10 N/mm after the lamination by a standard 90° peel test as above. Then the laminated glass plates were subject to the same creep test as above at 85° C. and 85% relative humidity, showing no creep occurring after 100 hours.

As the above-mentioned tests show, the encapsulant material produced by the method of the invention can be laminated at significantly lower temperatures than are conventional, while still retaining peel strength and creep resistance at 85° C. As a result, conventional lamination equipment and techniques can be used to assemble PV modules 1 incorporating temperature sensitive PV cells, such as those based on perovskite or dye-sensitised technologies.

In respect of the use of pigments, the presence thereof did not affect the mechanical properties of the modules produced. Furthermore, during annealing the pigmented encapsulant did not discolour or change properties, leading to the conclusion that no specific cross-degradation mechanisms between the pigments and encapsulants used takes place.

Chemical and UV stability test results for various samples produced according to the invention are reported below and in FIGS. 8-10.

Figure 8:
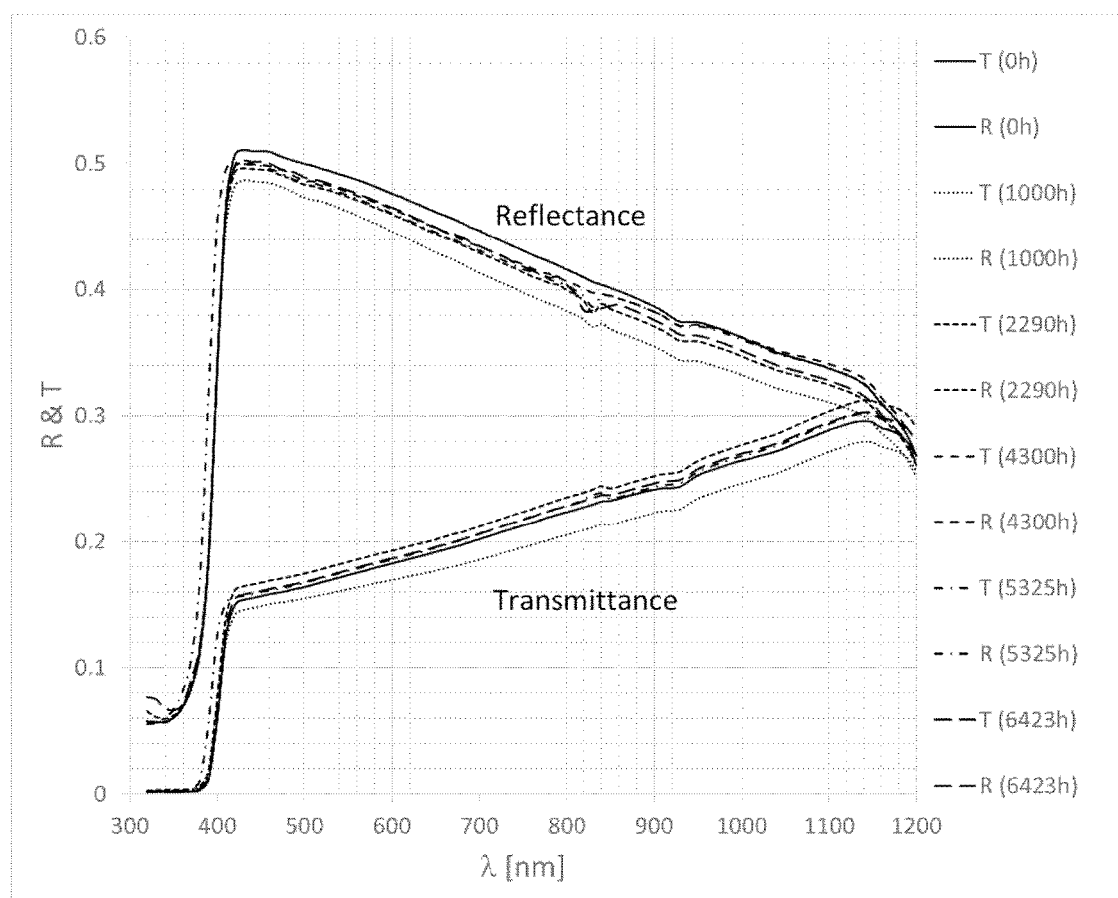
FIGS. 8-10; graphs illustrating environmental colour stability results obtained with PV cells according to the invention.

FIG. 8 illustrates a graph of reflectance and transmittance against wavelength at various equivalent exposure times in a standard QSun exposure chamber, with a module constructed according to FIG. 1, with a 0.8 mm thick polyolefin-type front encapsulant 21 (Polidiemme FE1252 EXP) containing 1 phr of TiO2 pigment (Dupont Ti-Pure R-960, median particle size: 0.5 micron). The front sheet was a 2 mm thick glass plate. As can be seen, there is substantially no change in either reflectance or transmittance up to 6423 h of sunlight exposure equivalent at any wavelength of light, variation being simply within measurement variation.

The perceived colour change was also measured according to the CIE (1994) standard:

| QUV [Hours] | $\Delta E_{CIE94}$ |
|---|---|
| 0 | — |
| 1000 | 1.85 |
| 2290 | 1.04 |
| 4300 | 0.79 |
| 5325 | 1.01 |
| 6423 | 0.69 |

As can be seen, the $\Delta E_{CIE94}$ values are very low, and remain substantially constant (within measurement variation) over significant exposure times. In practical terms, no colour change was observed.

Figure 9:
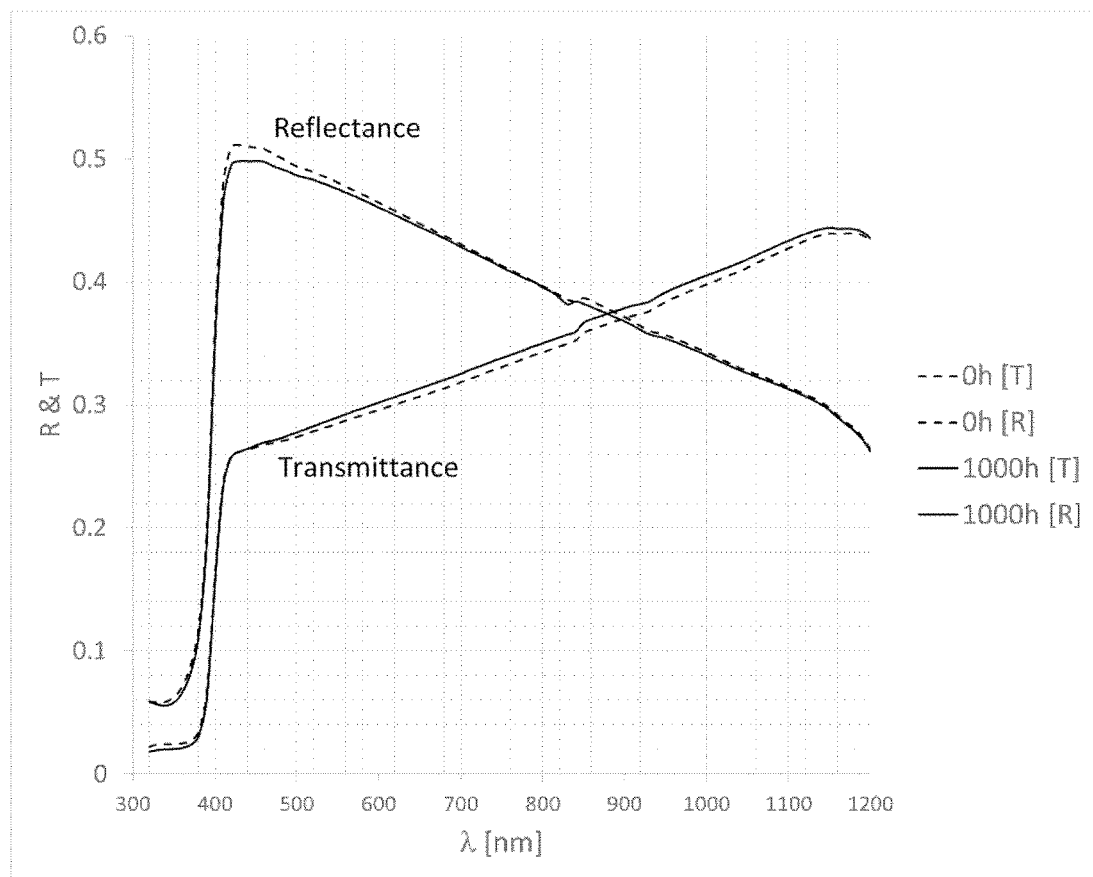

FIG. 9 illustrates a sample as in FIG. 8, subjected to 1000 hours of damp heat exposure according to IEC61215 at 85° C. and 85% relative humidity. Again, little or no difference in transmittance or reflectance was observed at any wavelength, and a $\Delta E_{CIE94}$ value of 0.62 at 1000 hours was attained. So again, in practical terms, no colour change was observed.

Figure 10:
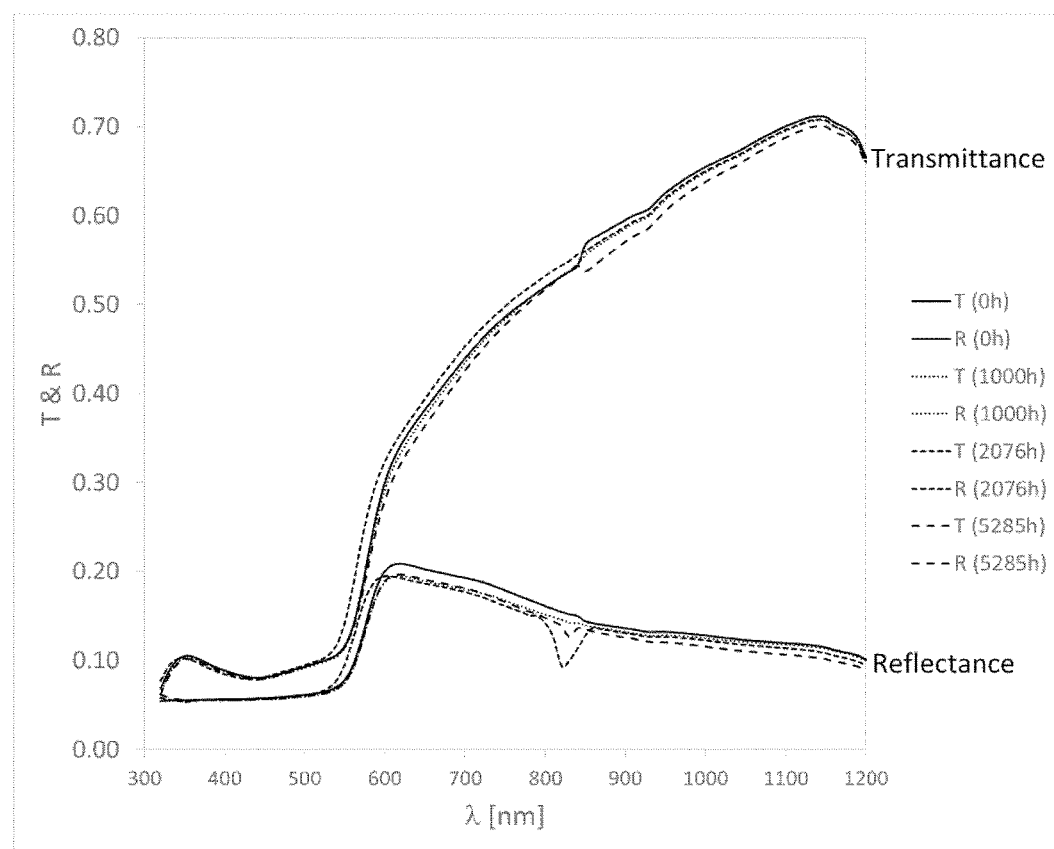

FIG. 10 illustrates a red coloured sample, similar to that used to generate the data of FIG. 8 except that the pigment was iron oxide (Rot 110M from Scholz Farbpigmente with a median particle size of 0.5 microns), at 0.1 phr concentration, giving the same results as before. $\Delta E_{CIE94}$ values were as follows.

| QUV [Hours] | $\Delta E_{CIE94}$ |
| --- | --- |
| 0 | — |
| 1000 | 1.06 |
| 2076 | 3.08 |
| 5285 | 1.03 |

Hence, again, in practical terms, no colour change was observed.

Figure 11:
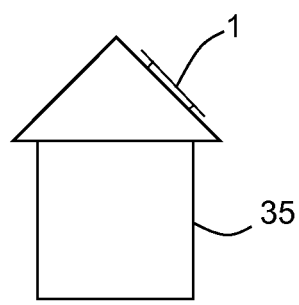
FIG. 11: a schematic representation of a building structure provided with a PV module.

Finally, FIG. 11 illustrates a photovoltaic module 1 according to the invention mounted on the roof of a building structure 35. Alternatively, the PV module 1 can be mounted to an exterior wall, or integrated into the structure of the wall and/or roof, e.g. as cladding. In general terms, the PV module 1 can be mounted on or in the structure of the building 35.

Although the invention has been described in terms of specific embodiments, variations thereto are possible without departing from the scope of the invention as defined in the appended claims.

The invention claimed is:

1. A method of manufacturing a photovoltaic module comprising at least a first layer and a second layer affixed to each other by an encapsulant, the method comprising steps of:
providing a lamination device;
disposing said first layer in said lamination device,
disposing upon said first layer an encapsulant material manufactured by the steps of:
providing a base resin comprising a silane-modified polyolefin and having a melting point below 90° C., a complex viscosity of greater than 10000 Pa·s at 85° C., and greater than 6000 Pa·s at 100° C. before lamination, and a tan delta value less than 1.0 at 85° C. and less than 1.2 at 100° C. before lamination;
forming a mixture of said base resin, pigment particles, and a first additive comprising a cross-linking catalyst, said cross-linking catalyst being present in a proportion of 0.01 to 20 parts per hundred of resin; and
melting said mixture at a temperature between 90° C. and 190° C. and extruding said mixture to form said encapsulant material;
disposing said second layer upon said encapsulant material; and
laminating said first layer, said second layer, and said encapsulant material under application of heat and pressure, said heat being applied at a temperature between 60° C. and 125° C. so as to crosslink said base resin such that said encapsulant material exhibits a complex viscosity greater than 15000 Pa·s at 85° C. and greater than 10000 Pa·s at 100° C., and a tan delta value of less than 1.0 at 85° C. and of less than 1.2 at 100° C. after lamination.

2. The method according to claim 1, wherein said encapsulant material is extruded as a sheet.

3. The method according to claim 1, wherein said encapsulant material is extruded and subsequently ground into a powder before being disposed upon said first layer.

4. The method according to claim 1, wherein said cross-linking catalyst is present in a proportion of 0.01 to 5 parts per hundred of resin.

5. The method according to claim 1, wherein melting said mixture occurs at a temperature between 160° C. and 180° C.

6. The method according to claim 1, wherein said heat is applied at a temperature of between 60° C. and 100° C. to crosslink said base resin.

7. The method according to claim 1, wherein said heat is applied at a temperature of between 70° C. and 90° C. to crosslink said base resin.

8. The method according to claim 1, wherein said mixture further comprises a second additive comprising at least one of: an antioxidant; an ultraviolet absorber; an ultraviolet stabiliser.

9. The method according to claim 1, wherein said catalyst comprises at least one of:
boric acid;
a metallocene catalyst;
a constrained geometry catalyst;
a chain shuttling-types of catalyst;
a multi-site catalyst such as a Ziegler-Natta or Phillips catalyst.

10. The method according to claim 1, wherein, after said step of lamination, said encapsulant material exhibits a tan delta value of less than 0.8 at 85° C., and less than 1.2 at 100° C., preferably less than 1.0 at 100° C.

11. The method according to claim 1, wherein a portion of said pigment particles have a diameter ranging from 100 nm to 50 μm.

12. The method according to claim 1, wherein said pigment particles are provided in said front encapsulation layer in a mass concentration ranging from 0.01 to 10 parts per hundred of resin.

13. The method according to claim 1, wherein said pigment comprises at least one of:
Zinc-based pigments;
Titanium-based pigments;
Iron-based pigments;
Chromium-based pigments;
Bismuth-based pigments;
Cobalt-based pigments;
Aluminium-based pigments;
Tin-based pigments;
Copper-based pigments.

14. A method of manufacturing a photovoltaic module comprising at least a first layer and a second layer affixed to each other by an encapsulant, the method comprising steps of:
- providing a lamination device;
- disposing said first layer in said lamination device;
- disposing in powder form upon said first layer an encapsulant material manufactured by:
  - providing a base resin in the form of a powder, said base resin comprising a silane-modified polyolefin and having a melting point below 90° C; and
  - mixing said base resin powder, pigment particles, and an additive in the form of a powder to form said encapsulant material, said additive comprising a cross-linking catalyst present in said encapsulant material in a proportion of 0.01 to 20 parts per hundred of resin;
- disposing said second layer upon said encapsulant material; and
- laminating said first layer, said second layer, and said encapsulant material under application of heat and pressure, said heat being applied at a temperature between 60° C. and 125° C. so as to crosslink said base resin.

15. The method according to claim 14, wherein said cross-linking catalyst is present in a proportion of 0.01 to 5 parts per hundred of resin.

16. The method according to claim 14, wherein melting said mixture occurs at a temperature between 160° C. and 180° C.

17. The method according to claim 14, wherein said heat is applied at a temperature of between 60° C. and 100° C. to crosslink said base resin.

18. The method according to claim 14, wherein said heat is applied at a temperature of between 70° C. and 90° C. to crosslink said base resin.

19. The method according to claim 14, wherein said base resin has a complex viscosity of greater than 10000 Pa·s at 85° c, and greater than 6000 Pa·s at 100° C. before lamination.

20. The method according to claim 14, wherein said base resin exhibits a tan delta value less than 1.0 at 85° C. and less than 1.2 at 100° C. before lamination.

21. The method according to claim 14, wherein said mixture further comprises a further additive comprising at least one of: an antioxidant; an ultraviolet absorber; an ultraviolet stabiliser.

22. The method according to claim 14, wherein said catalyst comprises at least one of:
- boric acid;
- a metallocene catalyst;
- a constrained geometry catalyst;
- a chain shuttling-types of catalyst;
- a multi-site catalyst such as a Ziegler-Natta or Phillips catalyst.

23. The method according to claim 14, wherein, after said step of lamination, said encapsulant material exhibits a complex viscosity greater than 15000 Pa·s at 85° C. and greater than 10000 Pa·s at 100° C.

24. The method according to claim 14, wherein, after said step of lamination, said encapsulant material exhibits a tan delta value of less than 0.8 at 85° C., and less than 1.2 at 100° C., preferably less than 1.0 at 100° C.

25. The method according to claim 14, wherein portion of said pigment particles have a diameter ranging from 100 nm to 50 µm.

26. The method according to claim 14, wherein said pigment particles are provided in said front encapsulation layer in a mass concentration ranging from 0.01 to 10 parts per hundred of resin.

27. The method according to claim 14, wherein said pigment comprises at least one of:
- Zinc-based pigments;
- Titanium-based pigments;
- Iron-based pigments;
- Chromium-based pigments;
- Bismuth-based pigments;
- Cobalt-based pigments;
- Aluminium-based pigments;
- Tin-based pigments; and
- Copper-based pigments.

28. A photovoltaic module manufactured by the method of claim 1.

29. A photovoltaic module manufactured by the method of claim 14.

30. A building structure comprising at least one photovoltaic module according to claim 14.

31. A building structure comprising at least one photovoltaic module according to claim 29.

* * * * *